United States Patent [19]
Ake

[11] Patent Number: 6,133,991
[45] Date of Patent: Oct. 17, 2000

[54] MULTI-SEGMENT COMPOSITE PHOTOCELL DEVICE

[75] Inventor: DuWain K. Ake, Tipp City, Ohio

[73] Assignee: Apache Technologies, Inc., Dayton, Ohio

[21] Appl. No.: 09/192,770

[22] Filed: Nov. 16, 1998

[51] Int. Cl.[7] .............................. G01C 3/08; G01B 11/26; H01L 27/00
[52] U.S. Cl. .................. 356/4.08; 250/208.1; 356/141.1; 356/400
[58] Field of Search .............................. 356/4.08, 141.4, 356/400; 250/208.1

[56] References Cited

U.S. PATENT DOCUMENTS

| | | |
|---|---|---|
| 4,129,224 | 12/1978 | Teach . |
| 4,676,634 | 6/1987 | Petersen . |
| 4,732,471 | 3/1988 | Cain et al. . |
| 4,907,874 | 3/1990 | Ake . |
| 4,976,538 | 12/1990 | Ake . |
| 5,343,033 | 8/1994 | Cain . |
| 5,471,049 | 11/1995 | Cain . |
| 5,486,690 | 1/1996 | Ake . |
| 5,886,776 | 3/1999 | Yost et al. ............................ 356/4.08 |

Primary Examiner—Stephen C. Buczinski
Attorney, Agent, or Firm—Frederick H. Gribbell; James P. Davidson

[57] ABSTRACT

An improved photocell configuration is provided to create a more accurate laser receiver that not only is very accurate and flexible in its operational capabilities, but also can greatly reduce the effect of rotational offset due to shading of the photocell. In one embodiment, a very long photocell is provided in which multiple split-cells are used to present a geometry that will tend to negate some of the effects of shading. The shading effects are minimized by having a different active photocell area along each vertical edge of the photocell. In another embodiment, a "segmented" photocell is used, in which the split-cell design of a long photocell is also divided into vertical segments. These segments can be re-configured so that alternating segments comprise a mirror image about the longitudinal of the long photocell. Such an arrangement tends to reduce the effect of rotational offset due to shading to an extremely small percentage of error. The segmented photocell configuration of the present invention is capable of being manufactured in "cell units" of relatively small length that can be stacked up next to one another to build a very long photocell. Each of the smaller segmented photocell structures can be manufactured using standard integrated circuit processing in lengths of less than two inches for ease of manufacture.

23 Claims, 8 Drawing Sheets

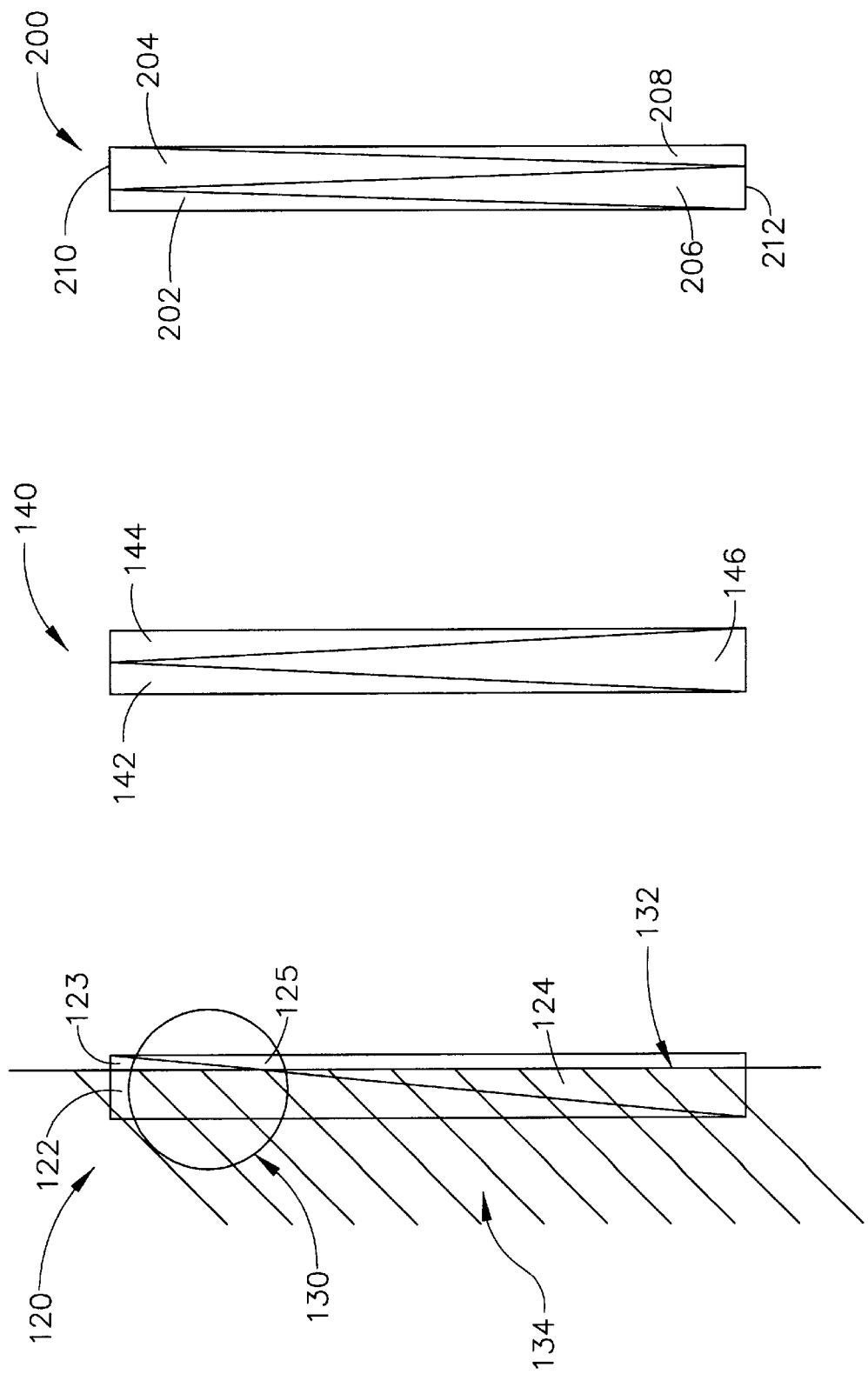

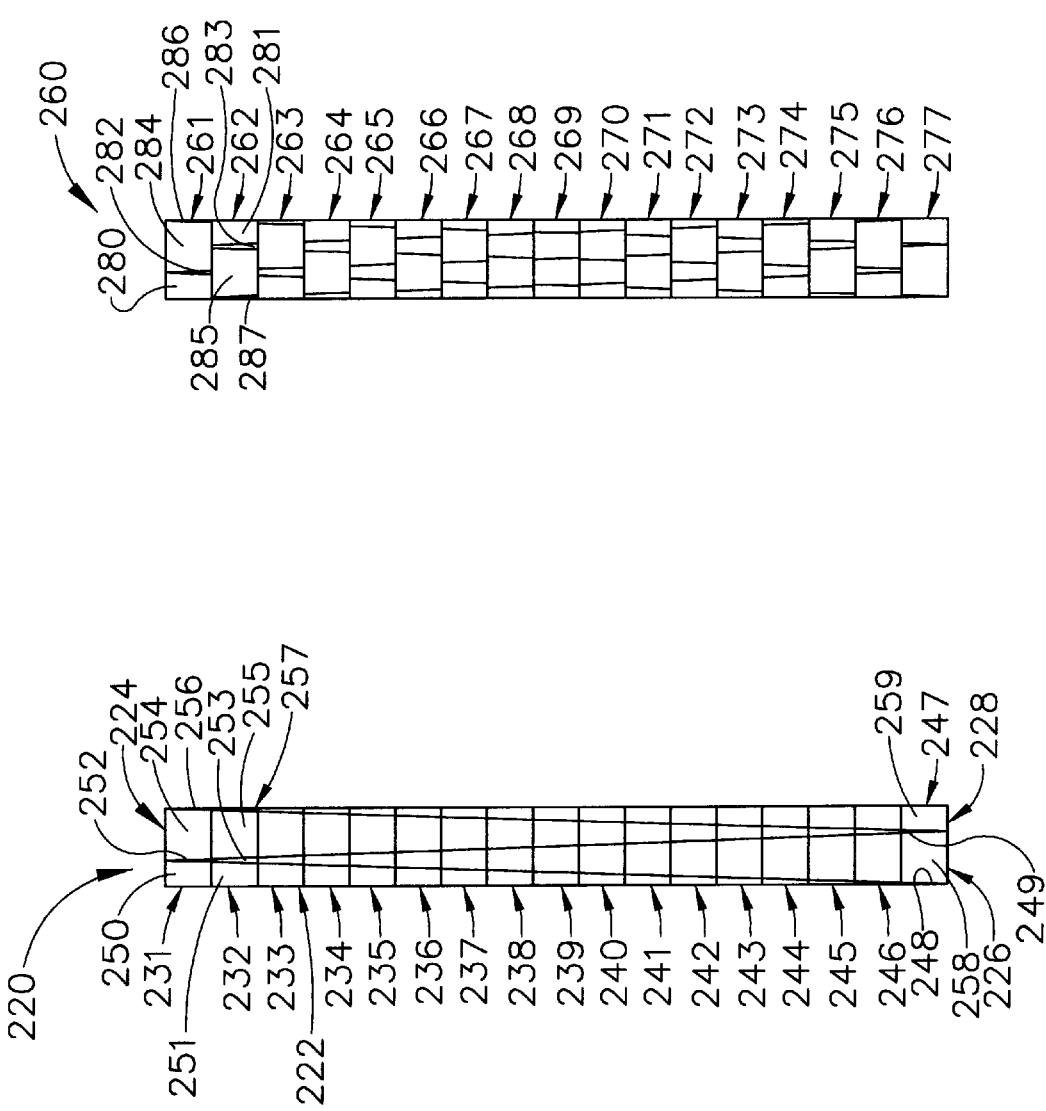

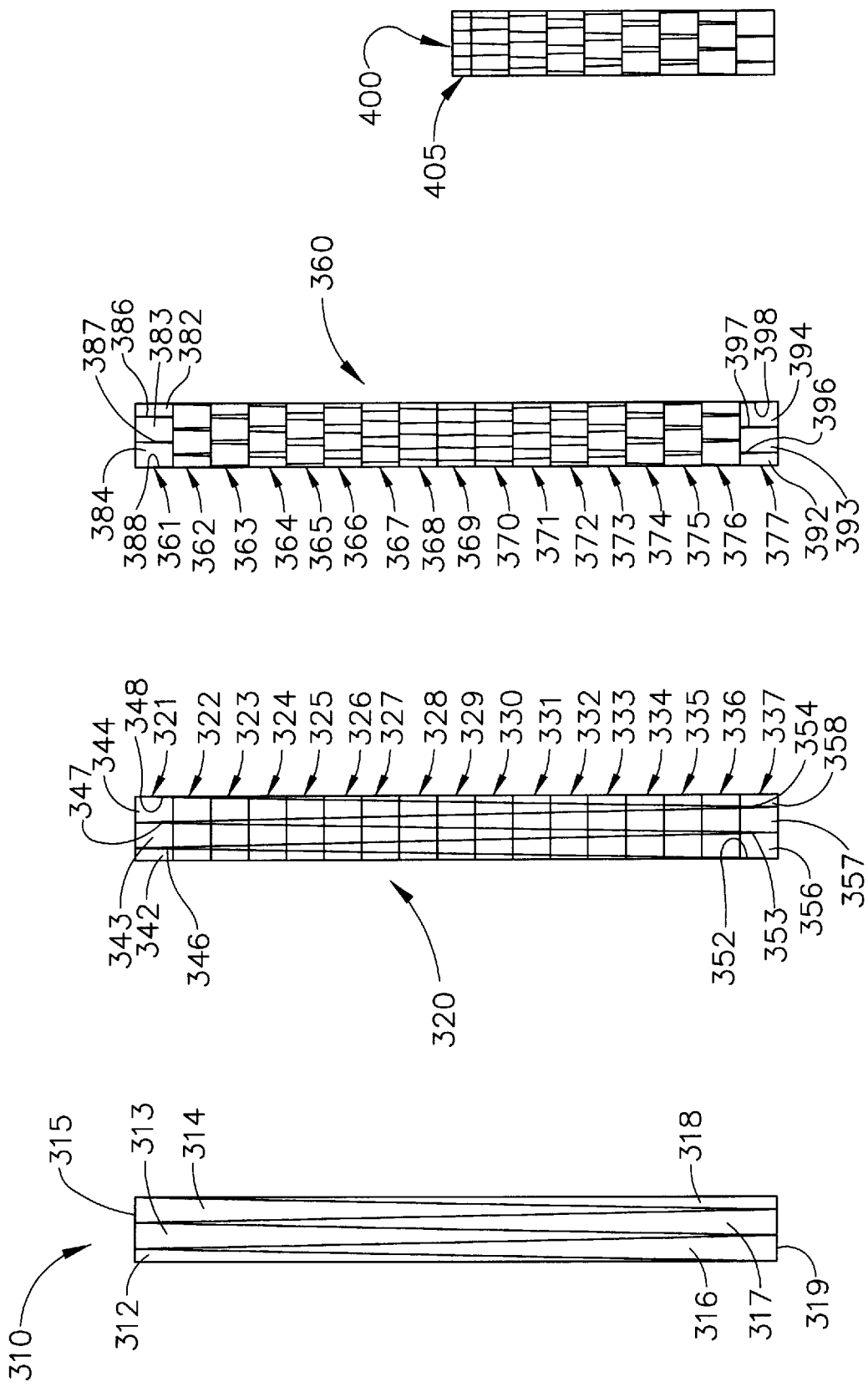

MULTI-SEGMENT COMPOSITE PHOTOCELL DEVICE

TECHNICAL FIELD

The present invention relates generally to laser light receiver equipment and is particularly directed to a composite photocell of the type which is divided into multiple segments each having multiple photocell areas. The invention is specifically disclosed as a composite photocell apparatus that is used to detect a rotating beam of laser light, in which the rotational offset component of error due to shading is virtually eliminated.

BACKGROUND OF THE INVENTION

One of the most common earth moving machines used in the general construction industry is the mechanized shovel. These machines are generally available in two varieties which are known as the "excavator" and the "backhoe." An excavator is generally the larger of the two machine types. A simplified drawing of a machine of this type is shown on FIG. 1.

An excavator, generally designated by the reference numeral 10, is usually a tracked machine with a pivot between its lower tracked carriage 18 and its cab assembly 20, which provides for side-to-side motion during operation. The digging apparatus generally consists of two extending members called arms, and a bucket 16. The first arm 12 is commonly called the "boom" and the second arm 14 is commonly called the "dipperstick."

A backhoe is generally smaller than an excavator but shares several similarities. A backhoe is generally a rubber tired machine which has its shovel portion on one end of the machine and another bucket on the other end. This second bucket apparatus is similar to a front-loader and is commonly used for moving material instead of digging. Like the excavator, the backhoe has a shovel implement which typically consists of a boom, dipperstick, and a bucket. This type of machine typically has a pivot between the cab portion and the boom arm to provide side-to-side motion while digging.

In operation, an operator of either a backhoe or excavator (hereinafter referred to generally as an "excavator") typically must dig to a particular elevation. If he digs too shallow then he must come back and rework the area; if he digs too deep then excessive fill material must be used. In order to determine the elevation in conventional systems, a second person is used to measure elevations for the machine operator. This person would either be using a laser system or an automatic level to determine the current elevation. If an automatic level is used then a third person is required to operate the level. This is further complicated if the digging depth is desired to be sloping, and not dug to a consistent (i.e., level) elevation. In this case, someone must keep track of the distance moved and periodically either add or subtract a certain elevation based on the distance and the desired slope.

Since some of the conventional digging systems in the prior art are so cumbersome and labor intensive, as described above, it would be very desirable to have available a digging system where the excavator operator can check his own digging elevation without the need for another person's help, and without stopping and getting out of the cab. Therefore, there is a need for an elevation indication system for excavators which is low cost, easy to install, is based on an absolute elevation reference, and if possible, provides elevation information while the operator is actually digging, rather than requiring him to stop to take a reading.

One major improvement in excavator systems is the use of a laser receiver mounted on the dipperstick of the excavator, in which the laser receiver intercepts the pulsed plane of laser light that is emitted by a rotating laser light source. Naturally, the more accurate the laser receiver, the greater the possible accuracy of the operation of the excavator. Therefore, a key element of many excavator systems is the ability of the laser receiver to operate with acceptable accuracy and in varying lighting conditions. To accomplish this function, a "long" laser receiver, generally designated by the reference numeral 30, is mounted on the dipperstick 14 of the machine 10 to accurately measure the position of the laser beam striking the receiver.

One way for a laser receiver to function at a wide variety of distances, and with different laser wavelengths, beam power, spot size, and spot shapes is to use a photocell configuration known commonly as a "split cell." FIG. 2 shows an example of a conventional photocell 60, for example, which is 12 inches (12"=30.5 cm) tall and 0.2 inches (0.2"=0.5 cm) wide in a split cell configuration (which is also known as a "dual triangle"). One of the triangles is designated "A" and represented by the reference numeral 62, while the other One of the triangles is designated "B" and represented by the reference numeral 64. It can be seen that the total surface area of cell "A" represented by the triangle 62 is equal to the total surface area of cell "B" represented by the triangle 64.

The split cell configuration is now well known in the art, and is commonly used to measure the position of light as described in U.S. Pat. No. 4,676,634 (by Peterson) and in other patents and product literature. This split cell configuration provides a linear indication of beam position that is independent of beam size, power, shape, etc. Using such a device, the beam position can be determined using the following equation:

Equation #1

$$Position = \frac{K_1 \cdot A + K_2 \cdot B}{A + B}$$

Using the Equation #1 to indicate position in inches, with twelve inches (12") at the top of the cell and zero inches (0") at the bottom, the following constants can be used:

$K_1=12$ $K_2=0$

This reduces Equation #1 to:

Equation #2

$$Position = 12 \cdot \frac{A}{A + B}$$

The configuration of FIG. 2 could theoretically perform the function described, however, it suffers from a variety of flaws and limitations. One very important problem is that it cannot be manufactured using existing manufacturing methods for silicon photocells. Presently, the largest silicon wafers used to manufacture single crystal silicon photocells are four inches (4"=10.2 cm) in diameter. Obviously it is impossible to manufacture a twelve inch (2") device from a 4" wafer.

In order to manufacture a photocell-based laser receiving device using existing process technology, the desired 12" long pattern can be divided into several lengths that are manufacturable. FIG. 3 shows a conventional 12" photocell configuration 70 where the 12" pattern has been broken into six portions of two inches (2"=5.1 cm) length each, thus creating a composite cell. The 2" length of each portion was chosen arbitrarily, however, it is roughly the limit for economical manufacturing of silicon photocells using existing processes. Each of the vertical portions on FIG. 3 comprises part of the photocell "A" and part of the photocell "B." To create a complete assembly, the vertical portion split areas are appropriately connected electrically, as follows: for cell "A" the split areas 71, 72, 73, 74, 75, and 76 are connected together, and for cell "B" the split areas 81, 82, 83, 84, 85, and 86 are connected together. It can be seen that the total surface area of cell "A" represented by the separate split areas 71–76 is equal to the total surface area of cell "13" represented by the separate split areas 81–86.

In the configuration of FIG. 3, three different cell patterns must be tooled to manufacture the composite cell, which will add to the tooling cost of the product. Furthermore, since the overall pattern for the device is 12" long, the sensitivity of system resolution and accuracy to noise and component tolerances is high. Existing products using this configuration for rotating laser beam detection have achieved 0.01" (0.025 cm) accuracy and resolution with a 2" long cell configuration. This 12" long configuration will be degraded by at least at factor of six. Since the split cell shapes are substantially symmetrical, it can be seen that the top cell portion 71, 81 is virtually identical in construction to the bottom cell portion 76, 86. The same is true for the central cell portions 73, 83 and 74, 84, and the intermediate cell portions 72, 82 and 75, 85.

A further improvement can be made to the photocell configuration, as shown in FIG. 4. By breaking the 12" length of the photocell assembly 100 down into a series of 2" long split cells and connecting them together, one composite photocell array can be formed. Each of the vertical portions on FIG. 4 comprises two triangular portions that are individually treated in the Equation #3 below, with the modifier that certain adjacent triangular areas are electrically connected together. For example, triangle "A" at 101 is not electrically connected to any other similar triangle, whereas there are two triangles "B" at 102 and 103 that are electrically connected together. Other paired triangles on FIG. 4 are 104–105 (cell "C"), 106–107 (cell "D"), 108–109 (cell "E"), and 110–111 (cell "F"). The final triangle "G" at 112 is an electrically independent cell.

The surface area of cells A (at 101) and G (at 112) in FIG. 4 are substantially equal to each other. Likewise, the combined surface area of paired cells B (at 102 and 103) are substantially equal to the combined surface area of the other paired cells on FIG. 4, i.e., cells C (at 104, 105), cells D (at 106, 107), cells E (at 108, 109), and cells F (at 110, 111). Furthermore, the combined areas of cells A (at 101) and G (at 112) are substantially equal to each of the paired cells B–F.

The laser beam position of the photocell configuration illustrated in FIG. 4 is determined by the following Equation #3:

Equation #3

$$Position = \frac{K_1 \cdot A + K_2 \cdot B + K_3 \cdot C + K_4 \cdot D + K_5 \cdot E + K_6 \cdot F + K_7 \cdot G}{A + B + C + D + E + F + G}$$

Once again to indicate position in inches, with 12 at the top and 0 at the bottom, the following constants could be used:

$K_1=12$
$K_2=10$
$K_3=8$
$K_4=6$
$K_5=4$
$K_6=2$
$K_7=0$

The use of the above constants reduced Equation #3 to:
Equation #4

$$Position = 12 \cdot \frac{A + 5/6 \cdot B + 2/3 \cdot C + 1/2 \cdot D + 1/3 \cdot E + 1/6 \cdot F}{A + B + C + D + E + F + G}$$

This configuration of FIG. 4 can be manufactured using existing processes and will function with good accuracy and resolution, but still suffers from an important problem. This problem is called "rotational offset," which occurs when the photocell array is not directly facing the laser transmitter. In this situation, the housing that contains the photocell array may shade a portion of the photocell. If partial shading occurs, one side of the photocell may not receive any laser energy while the other side may receive full energy. The result in the laser receiver system is that the calculated position derived from the photocell outputs will be in error. And this could be as much as 2" of error in the laser receiver system described above.

In order to examine this phenomenon, a single photocell 120 having a 2" split cell pattern is depicted in FIG. 5. In this illustration, a laser beam is depicted at the circle 130 as striking near the top of the photocell 120 and the indicated line shading portion of the drawing (to the left of the vertical line 132 on FIG. 5) depicts the physical area 134 of the photocell that may be shaded from the laser light source due to the relative positioning of the receiver housing. Without the shading effect, the majority of the laser beam spot 130 would impact the surface of the triangular split cell portion at 122, as compared to the amount of the laser beam spot 130 that would impact the surface of the triangular split cell portion at 124. However, because of the shading effect, this will not be true, and a large error due to rotational offset will occur.

It is clear from FIG. 5 that, instead of the majority of the laser energy striking the top portion of the photocell in the correct proportions as described in the previous paragraph, the laser beam spot will impact an area of the split cell portion 124 at the reference numeral 125, which is fairly close to being the proper amount of surface area. Unfortunately, the laser beam spot will impact an area of the split cell portion 122 at the reference numeral 123 which is greatly reduced in surface area as compared to the proper amount to register a correct spot position reading. Because of the shading, there are nearly equal parts of the laser beam striking the upper and lower portions 122 and 124. The result of this shading effect is that there is a direct position error generated by the positioning of the housing that cannot be either detected or corrected for when using this photocell design.

This shading problem is well known in the laser receiver industry and has been described and partially corrected in U.S. Pat. Nos. 4,907,874 and 4,976,538 (by Ake). In U.S. Pat. No. 4,907,874, the configuration described suffers from none of the rotational offset problem, however, it does suffer from linearity problems. This linearity problem makes this particular design unsuitable for handling the variety of laser beam sizes and shapes required in the construction laser industry.

In U.S. Pat. No. 4,976,583, the linearity problem is corrected with a slight penalty of re-introducing a small amount of rotational offset. The main penalty associated with the configuration of U.S. Pat. No. 4,976,583 is that, since its photocell pattern is very complex, it is difficult and expensive to manufacture. Also, since the 2" length of the cell is roughly at the limit of what can be manufactured, only a few manufacturers can produce the part, and the manufacturing yield and thus cost is negatively impacted. Further, since it is so complex, it is not easily stacked on end, as opposed to the photocell assembly described in FIG. 4. It is desirable, therefore, to find a simpler photocell configuration that can be stacked on end to create a composite array of any arbitrary length.

FIG. 6 illustrates in improved conventional photocell 140 that is constructed in a two-split cell configuration (of three cell triangles 142, 144, and 146 ) where the split cells are arranged side-by-side. This configuration reduces the amount of rotational offset that will be produced by cell shading up to the point at which only a small portion of the cell is left unshaded. However, it would be a further improvement to provide a photocell arrangement that reduced the error due to rotational offset to an even greater extent, so that rotational offset error is largely corrected when only an extremely small portion of the photocell is unshaded.

SUMMARY OF THE INVENTION

Accordingly, it is a primary object of the present invention to provide a very long laser receiver that can function at a wide variety of distances and with different laser wavelengths, beam power, spot size, and spot shape.

It is another object of the present invention to provide a very long laser receiver that can achieve a greater accuracy than in the prior art while functioning at a wide variety of distances, and with different laser wavelengths, beam power, spot size, and spot shape.

It is a further object of the present invention to provide a very long laser receiver that can correct for rotational error due to shading while functioning at a wide variety of distances, and with different wavelengths, beam power, spot size, and spot shape.

Additional objects, advantages and other novel features of the invention will be set forth in part in the description that follows and in part will become apparent to those skilled in the art upon examination of the following or may be learned with the practice of the invention.

To achieve the foregoing and other objects, and in accordance with one aspect of the present invention, a more accurate laser receiver used in the construction industry is made possible by providing an improved photocell configuration that not only is very accurate and flexible in its operational capabilities, but also can greatly reduce the effect of rotational offset due to shading of the photocell. In one embodiment, a very long photocell is provided in which multiple split-cells are used to present a geometry that will tend to negate some of the effects of shading. The shading effects are minimized by having an active photocell area along each vertical edge of the photocell, and one of the vertical edges is connected to a "cell A" while the other vertical edge is connected to a "cell B."

In another embodiment, a "segmented" photocell is used, in which the split-cell design of a long photocell is also divided into vertical segments. These segments can be re-configured so that alternating segments comprise a mirror image about the longitudinal of the long photocell. Such an arrangement tends to reduce the effect of rotational offset due to shading to an extremely small percentage of error.

The segmented photocell configuration of the present invention is capable of being manufactured in "cell units" of relatively small length that can be stacked up against one another to build a very long photocell, even as much as twelve inches or more in length. Each of the smaller segmented photocell structures can be manufactured using standard integrated circuit processing in lengths of less than two inches for ease of manufacture. Such segmented photocell structures can then be mounted adjacent to each other like integrated circuits, in which the longitudinal axis of one such structure becomes the longitudinal axis of each other similar structure. In this manner, a large number of structures can be stacked up along the same longitudinal axis to create the very long composite photocell.

By use of the construction techniques described for the present invention, a very long composite photocell configuration can be manufactured for a cost similar to existing designs of much lower performance characteristics. The improved photocell of the present invention can function at a wide variety of distances, and with different laser wavelengths, beam power, spot size, and spot shape.

Still other objects of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

FIG. 5 is a diagrammatic view of a prior art single split-cell photocell that illustrates the effect of shading for a particular laser beam spot location.

FIG. 6 is a diagrammatic view of a double split-cell photocell known in the prior art.

FIG. 7 is a diagrammatic view of an improved multiple split-cell photocell.

FIG. 8 is a diagrammatic view of an improved split-cell photocell which is segmented.

FIG. 9 is a diagrammatic view of the segmented photocell of FIG. 8, in which alternating segments are mirrored about its longitudinal axis.

FIG. 10 is a diagrammatic view of a segmented and mirrored composite photocell which comprises one-half of the photocell of FIG. 9.

FIG. 12 is a diagrammatic view of another improved photocell using multiple split-cells.

FIG. 13 is a diagrammatic view of the improved split-cell design of FIG. 12, while in addition being segmented.

FIG. 14 is a diagrammatic view of the segmented photocell of FIG. 13 in which alternating segments are mirrored about its longitudinal axis.

FIG. 15 is a diagrammatic view of a segmented photocell that comprises one-half of the photocell of FIG. 14.

DETAILED DESCRIPTION OF THE PREFERRED EMBODIMENT

Figure 1:
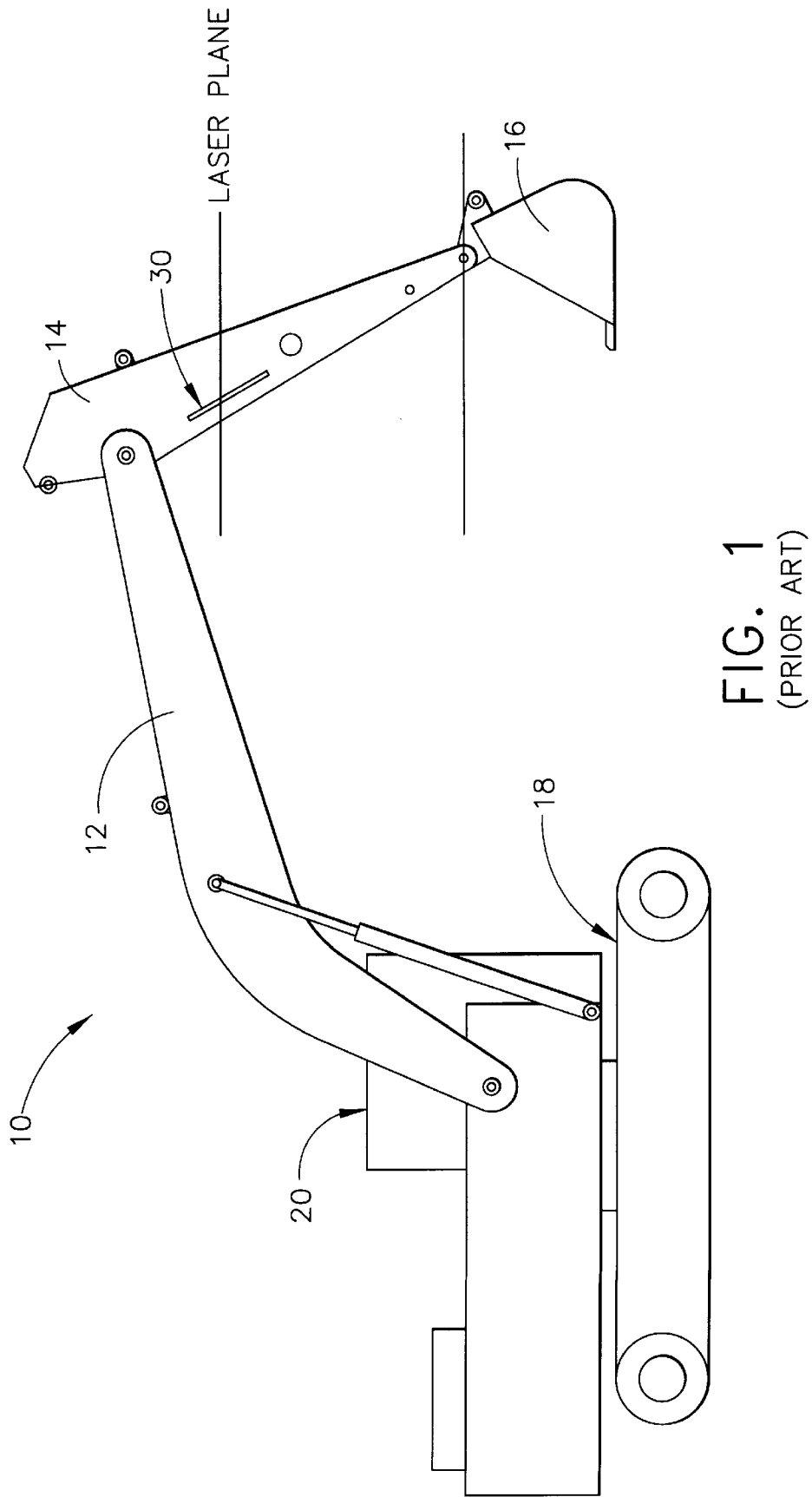
FIG. 1 is an elevational view of an excavator known in the prior art that has a laser receiver mounted to its dipper stick, such that the laser receiver intercepts a plane of laser light being emitted by a rotating laser transmitter.

Reference will now be made in detail to the present preferred embodiment of the invention, an example of which is illustrated in the accompanying drawings, wherein like numerals indicate the same elements throughout the views.

Referring now to the drawings, FIG. 7 shows an improved photocell configuration in which a single cell 200 is composed of three split cells comprising four cell triangles 202, 204, 206, and 208, which are arranged side-by-side. This configuration further reduces the rotational offset, as compared to the photocell 140 illustrated in FIG. 6, up to the point at which only a very small portion of the cell is left unshaded. This is accomplished by providing a smaller triangular area with respect to the overall cell width, either cell triangle 202 or 208, along the very edge (i.e., the vertical edge as seen on FIG. 7) of the photocell. In FIG. 7, it is preferred that the triangles 202 and 204 be electrically connected together (as a "cell A"), and that the triangles 206 and 208 be electrically connected together (as a "cell B").

In order to achieve a further reduction in rotational offset, additional modifications to the photocell configuration can be made. One such modification is illustrated in FIG. 8, in which a composite photocell 220 is depicted as having the same basic cell triangles from FIG. 7, but also divided vertically into seventeen (17) equal "segments" 231–247. Each of these vertical (as seen in FIG. 8) segments preferably is smaller than the smallest expected laser beam size (roughly 0.25"=0.64 cm) so that even the smallest laser beam will strike at least two segments at once. The larger triangular shapes (in gross) are designated by the reference numerals 222, 224 (for what was called "cell A"), and 226, 228 (for what was called "cell B"). Of course, with the additional segmenting in the vertical direction, instead of there being four physically separate photocell areas (as in FIG. 7), there are now sixty-eight (68) separate photocell areas (referred to herein as "separate photocells").

As used herein, the term "segment" refers to the one of the individual portions of a composite photocell, in which these individual portions are divided by transverse lines that create multiple portions of physical photocell areas along the longitudinal axis of the composite photocell. In the drawings corresponding herewith, the views all show a plurality of segments that are stacked vertically on top of one another, in which the transverse lines are horizontal lines, and in which the longitudinal axis is the vertical axis. In general, each of the separate portions (i.e., "segments") is further divided into a plurality of separate photocells of either triangular or trapezoidal shape, which may or may not be electrically isolated from one another. As will be seen hereinbelow, it is typical in the present invention to electrically connect in parallel at least two of the separate photocells of each of the individual segments.

The separate photocells of the composite photocell 220 in FIG. 8 are preferably electrically connected to certain others of these separate photocells. For example, the top segment 231 of FIG. 8 is depicted as having four photocell areas, designated as 250, 252, 254, and 256. The second segment from the top is depicted as having four photocell areas, designated as 251, 253, 255, and 257. It is preferred that the photocell areas 250, 251, 254 and 255 be electrically connected together (to form a "cell A" producing an electrical output signal), and that the photocell areas 252, 253, 256, and 257 be electrically connected together (to form a "cell B" producing an electrical output signal).

The bottom segment 247 comprises four photocell areas, designated at 248, 249, 258, and 259. This bottom segment 247 is identical in size and shape to the top segment 231, and it is preferred that the photocell areas 248 and 249 be electrically connected together (to further form the "cell A" that produces an electrical output signal), and that the photocell areas 258 and 259 be electrically connected together (to further form the "cell B" that produces an electrical output signal).

As an alternative embodiment, each of the segments 231–247 of photocells in the composite photocell 220 could be electrically isolated from one another, thereby providing a large number of electrical output signals which could be used to detect the laser beam position as it strikes the photocell 220. Such a design, however, would require a more complex set of electronics, although it is quite usable as a laser light receiver. While this more complex electronic design is not the preferred mode of construction of the present invention, it will be understood that any combination of electrical connections and electrical output signals can be used with the composite photocell 220 of FIG. 8 without departing from the principles of the present invention.

Once the composite photocell 220 has been divided into vertical segments, a new composite photocell configuration can be constructed as depicted in FIG. 9, in which every other vertically divided segment can then be mirrored about the longitudinal (i.e., vertical in FIG. 9) axis of the photocell to create this new composite photocell structure, designated by the reference numeral 260. This mirroring has no effect on the position measurement of the laser receiver, however, it results in an even further reduction of the rotational offset as compared to the photocells 200 and 220 of FIGS. 7 and 8, respectively. This improvement is due to the fact that, as shading occurs from one side of the photocell 260, an error is developed in one direction for a given illuminated segment; however, its adjacent segments produce a positional error in the opposite direction that will partially cancel out the error of the first segment. This partial cancellation of the first segment's error provides a very accurate positioning signal for the purposes of determining the correct laser beam impact location on the laser receiver that mounts this composite photocell 260.

Referring to FIG. 9, there are seventeen individual segments 261–277 that are stacked upon one another in the vertical direction. These stacked segments are identical in size and physical location to those segments 231–247 depicted in the composite photocell 220 of FIG. 8.

The overall gross "V" shapes of the triangles 222, 224, 226, and 228 of FIG. 8 are not easily discernible on FIG. 9, because of the mirroring of half of the segments on the composite photocell 260 of FIG. 9. Every other segment on composite photocell 260 is identical to its corresponding segment on the composite photocell 220. However, the interspersed alternating segments of the composite photocell 260 are mirror images of the corresponding segments of the composite photocell 220. For example, the top segment 261 is depicted as having four photocell areas, designated as 280, 282, 284, and 286. These photocell areas directly correspond with the areas 250, 252, 254, and 256 found on FIG. 8. The photocells 252, 282, 256, and 286 are each a thin triangular area of semiconductor material. As in FIG. 8, the photocells 282 and 286 are electrically connected together (preferably in parallel) to form a "cell A" that produces an electrical output signal. Similarly, the photocells 250 and 280 each comprise an identically-sized trapezoidal area, and the photocells 254 and 284 each comprise a larger trapezoidal area of semiconductor material. These areas 280 and 284 are electrically connected together (preferably in parallel) to form a "cell B" that produces an electrical output signal.

In this example, the next segment down from the top shows the symmetrical mirroring effect when comparing the composite photocells of FIG. 8 to FIG. 9. In FIG. 8, there are four trapezoidal areas comprising individual photocells, having the reference numerals 251, 253, 255, and 257. These trapezoidal areas correspond in dimension on FIG. 9 to the areas having the reference numerals 281, 283, 285, and 287. As is easily discerned by viewing both FIGS. 8 and 9, these corresponding areas are on opposite sides of the longitudinal axis of the composite photocells 220 and 260, respectively.

As described above, every other segment of the composite photocell 260 is either identical to the corresponding segment of the photocell 220, or is a mirror image of that particular segment. On FIG. 9, the mirrored segments are 262, 264, 266, 268, 270, 272, 274, and 276, with respect to those corresponding segments of FIG. 8.

In one preferred embodiment, the overall outer dimensions of the composite photocell 260 of FIG. 9 are 0.15" (0.38 cm) in width by 2.0" (5.1 cm) in height. Since the preferred height of the composite photocell 260 is nearly against the upper limit of photocell manufacturing using processing available today, another preferred embodiment is depicted in FIG. 10, which illustrates a composite photocell 290 that is one-half the size of the two inch photocell 260. This half-size composite photocell 290 is essentially of the same physical configuration, but split in half along the transverse axis, which means that the middle segment 269 of the composite photocell 260 (of FIG. 9) is essentially cut in half to create a one-half height segment 295 (as seen in FIG. 10).

Figure 11:
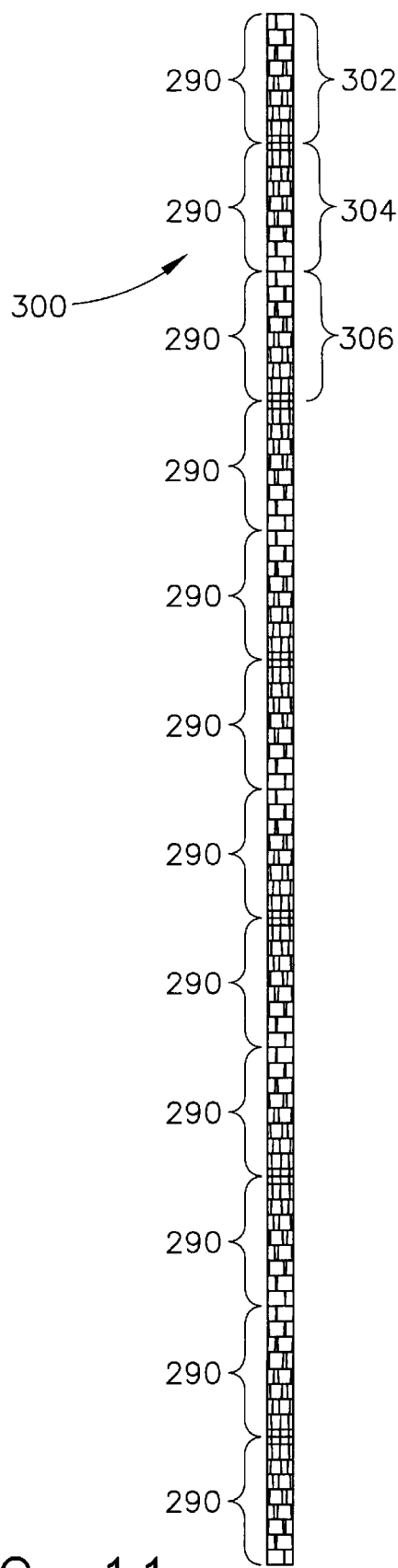
FIG. 11 is a very long composite photocell that is made of twelve of the half-height segmented photocells of FIG. 10.

The preferred dimensions of the composite photocell 290 are 0.15" by 1.0", which means that a large number of photocell semiconductor manufacturers would be able to fabricate this particular part. Two of the composite photocells 290 can then be stacked together so that their one-half sized segments 295 would be butted against one another to create a longer photocell assembly. Such an assembly is illustrated in FIG. 11, which shows a 12" (30.5 cm) tall photocell assembly, generally designated by the reference numeral 300. As can be seen in FIG. 11, the composite photocell assembly 300 actually comprises twelve individual one-inch tall composite photocells 290, in which every other composite photocell 290 is inverted with respect to its adjacent composite photocells. In this manner, the photocell assembly 300, with the proper electrical connections, is equivalent to stacking up six composite photocells 260, and is also equivalent to having a single twelve-inch photocell assembly, if such a photocell could possibly be manufactured.

Figures 2, 3, 4:
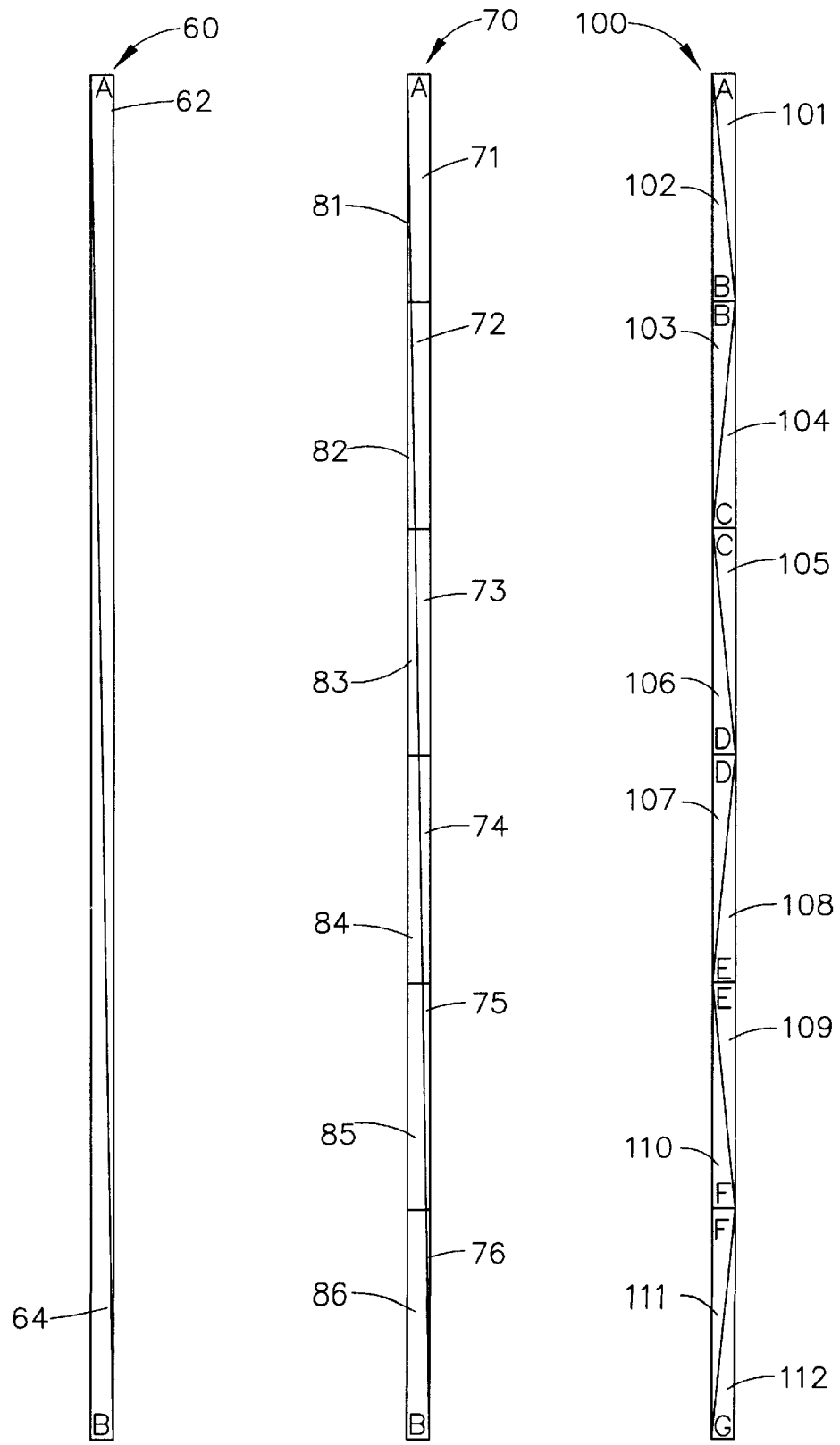
FIG. 2 is a diagrammatic view of a split-cell photocell known in the prior art.
FIG. 3 is a diagrammatic view of a multiple split-cell photocell assembly known in the prior art.
FIG. 4 is a diagrammatic view of a multiple cell split-cell photocell assembly known in the prior art.

The electrical outputs of the photocell assembly 300 would be the same as described for the composite photocells 220 and 260. In other words, there would be an "A" cell output signal and a "B" cell output signal, which would be used to detect the proper position of the laser beam as it strikes the photocell assembly 300. Each of these "A" cell and "B" cell outputs would be appropriated connected in the same manner as seen in the photocell stack-up of FIG. 4. Preferably, the "B" cell output of the top segment 302 would be connected, for example, to one of cell outputs of the second from top segment 304. Then the other cell output of segment 304 would be connected to one of the cell outputs of segment 306, and so on.

The 12" (or longer) "tall" photocell assembly 300 of FIG. 11 would be very useful in vehicles used in the construction industry, such as in backhoes, bulldozers, and excavators. A somewhat shorter "tall" photocell assembly also could be used—even up to 6 inches (6"=15.2 cm) or longer—to create a highly accurate hand-held laser receiver.

In FIG. 12, another improved photocell configuration is depicted in which a single cell 310 is composed of five split cells comprising six cell triangles 312, 313, 314, 316, 317, and 318, which are arranged side-by-side. This configuration further reduces the rotational offset as compared to the photocell 140 illustrated in FIG. 6. This is accomplished, much like the cell 200 in FIG. 7, by providing a smaller triangular area with respect to the overall cell width, either cell triangle 312 or 318, along the very edge of each vertical side of the photocell.

In FIG. 12, it is preferred that the triangles 312, 313, and 314 be electrically connected together (as a "cell A"), and that the triangles 316, 317, and 318 be electrically connected together (as a "cell B"). Similar to cell 200 of FIG. 7, in this configuration a spot of laser light that impacts either the top edge 315 or the bottom edge 319 will almost immediately strike a portion of both cells "A" and "B," thereby tending to eliminate the shading effect to a great extent.

In FIG. 13, the same V-shaped cell geometry as seen FIG. 12 is present in a segmented composite photocell 320. The same basic cell triangles are again used, and they are divided vertically into seventeen (17) equal segments 321–337. As in the photocell 220 of FIG. 8, each of the vertical segments preferably is smaller than the smallest expected laser beam size (roughly 0.25") so that even the smallest laser beam will strike at least two segments at once. In FIG. 12 there were six separate photocell areas and, because of the segmentation, the composite photocell 320 has 102 separate photocells.

The separate photocells of composite photocell 320 in FIG. 13 are preferably electrically connected to certain others of the separate photocells. For example, the top segment 321 of FIG. 13 is depicted as having six photocell areas, designated as 342, 343, 344, 346, 347, and 348. It is preferred that the photocell areas 342–344 be electrically connected together in parallel to form a "cell A" that produces an electrical output signal, and that the photocell areas 346–348 be electrically connected together in parallel to form a "cell B" that produces a separate electrical output signal.

The bottom segment 377 of composite photocell 360 (see FIG. 14) is constructed of separate photocells having virtually an identical geometry. The separate photocells of segment 377 comprise the photocell areas 392, 393, 394, 396, 397, and 398. Three of the separate photocells are connected in parallel to form a portion of the "cell A" and three are connected in parallel to form a portion of the "cell B." Since the large surface areas in the top segment 361 comprise a portion of "cell A," then in the bottom segment 377 it is the small surface area portions that comprise part of "cell A." This means that the separate photocells 396–398 are connected in parallel to the separate photocells 382–384 of the top segment 361. Similarly, the separate photocells 392–394 of bottom segment 377 are connected in parallel to the separate photocells 386–388 of the top segment 361.

Figure 16:
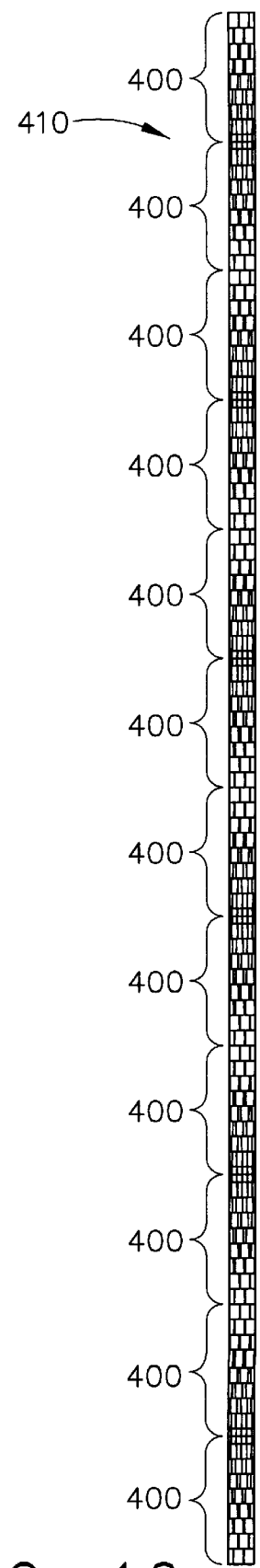
FIG. 16 is a diagrammatic view of a very long composite photocell which comprises twelve of the half-height photocells of FIG. 15.

The preferred outer dimensions of the composite photocell 360 are 0.15" in width by 2" in height. Since, because of its height, this composite photocell may be difficult to manufacture, the composite photocell 360 can be split in half, as depicted in FIG. 15 by the composite photocell 400. Photocell 400 includes a half-size (in the vertical direction) segment designated by the reference numeral 405. It can be seen from FIGS. 14 and 15 that two of the half-size composite photocells 400 can be stacked on top of one another, in which the top unit is inverted with respect to the bottom unit, and this arrangement will virtually duplicate the composite photocell 360 of FIG. 14. A large stack-up of twelve such half-size composite photocells is illustrated in FIG. 16, by the composite photocell 410.

The cell geometry of both composite photocells 260 and 360 of FIGS. 9 and 14, respectively, results in a cell geometry that is fairly simple, regular, and symmetrical, so that they can be divided in half vertically to create the half-size composite photocells 290 and 400. The result of this final division is that each individually-manufactured "cell unit" of the composite array of cells is only one inch by 0.15 inches. This is a much smaller cell area (as compared to the full-height composite photocells 260 and 360) and, therefore, is more readily produced by a photocell manufacturer even where three inch (7.6 cm) wafers are being used in the manufacturing process. Furthermore, wafer utilization will be better and yield will be higher as a result of the smaller area of each individual cell unit. These factors will all help to reduce the cost of each individual cell unit and, therefore, the overall composite photocell.

The final twelve-inch composite photocells 300 and 410 each provide a fully linear photocell arrangement that will perform independent of beam size, power, wavelength, and shape over the entire length of the laser receiver. Moreover, the rotational offset that plagues a conventional split cell configuration is greatly reduced, although not entirely eliminated.

It will be understood that various segmented photocell geometries not illustrated in the drawings of this patent can be constructed to perform in an improved manner compared to conventional photocells without departing from the principles of the present invention. It will be further understood that, using the principles of the present invention, large stacks of smaller composite photocells can be constructed having dimensions other than those described herein without departing from the principles of the present invention, while maintaining improved performance over conventional photocells. It will also be understood that other cell geometries besides using a symmetrical mirrored design could be constructed without departing from the principles of the present invention.

Figure 17:
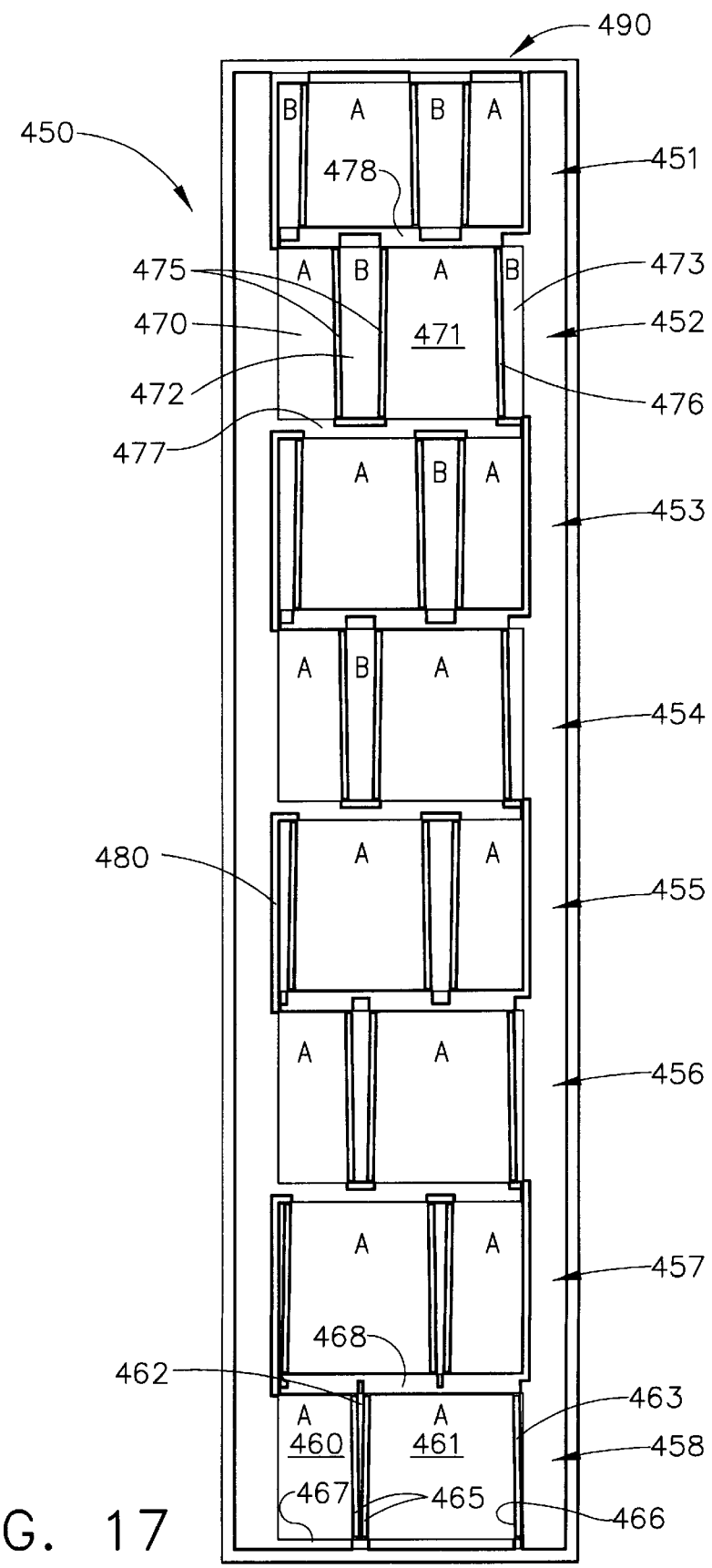
FIG. 17 is a diagrammatic view of an eight-segment photocell structure that can be manufactured using standard photocell processes, and can be stacked with other such structures to create a very long photocell.
Figure 18:
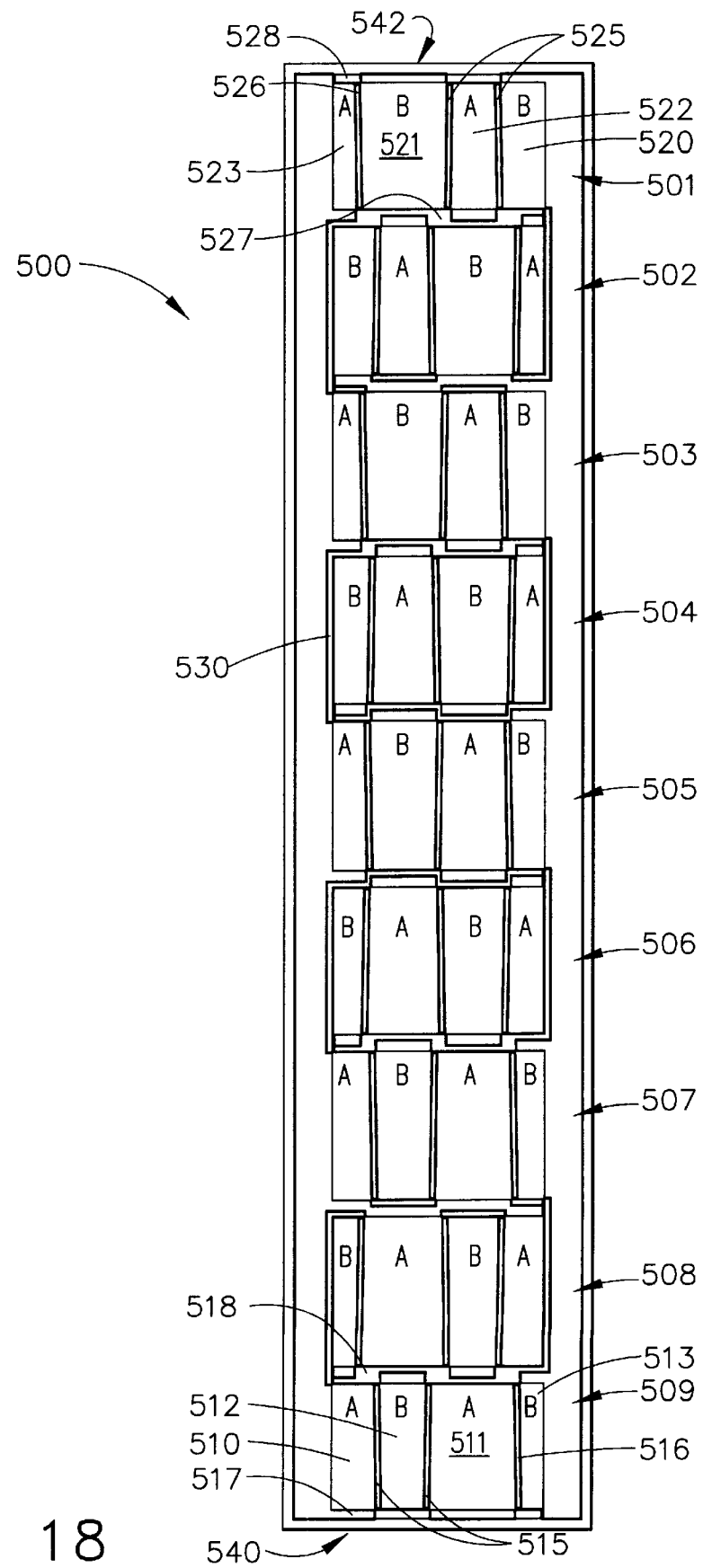
FIG. 18 is a diagrammatic view of another segmented photocell having nine segments, which can be stacked with two of the photocells of FIG. 17 to create a symmetrical two-inch tall photocell assembly.

Other example composite photocells are illustrated in FIGS. 17 and 18, which show certain of the construction features in greater detail. FIG. 17 illustrates a composite photocell generally designated by the reference numeral 450, and having the preferred dimensions of 0.15" (0.38 cm) in width (as viewed on FIG. 17) by 0.63" (1.6 cm) in height (as viewed on FIG. 17). Composite photocell 450 is divided into eight segments numbered 451–458. As in the previously described composite photocells, each of the segments 451–458 includes more than one separate photocell area, and some of these areas are connected to an overall "cell A" and some are connected to an overall "cell B." The areas of "cell A" and "cell B" for composite photocell 450 are labeled on FIG. 17, where space permits on the drawing.

For the bottom segment 458, separate photocells 460 and 461 are included as part of "cell A," and separate photocells 462 and 463 are part of "cell B." In the second from top segment 452, separate photocells 470 and 471 make up part of "cell A" and separate photocells 472 and 473 make up part of "cell B." The alternating segments are mirror images of what one would expect if making a composite photocell having a set of gross "V" shapes.

The photocell surfaces that are exposed to light preferably comprise diffused silicon that has been doped with the proper impurities to create a p-n junction that will conduct electricity when exposed to the correct frequencies of electromagnetic energy. Since these active areas of the composite photocell 450 must remain isolated from adjacent active areas, there are other portions of the photocell material that act as a barrier between the active cells. These barriers typically comprise non-diffused silicon, which acts as an electrical insulator. In addition, these barriers are typically coated with layers of metal, including a top layer of gold or aluminum so that wires or other electrical conductors can be soldered thereto.

It will be understood that the fabrication of photocells is well understood in the art, and preferably comprises typical integrated circuit construction techniques. These construction techniques not only include the creation of insulative barriers between active photocell areas, but also to manufacture the electrically conductive pathways between active photocell areas that are to be electrically connected together. While FIG. 17 does not show an entire electrical connection diagram, it will be understood that electrically conductive pathways connect the active areas that make up the overall "cell A" (e.g., separate photocells 460 and 461) so as to cause the active areas to be connected in parallel to one another. The same is true for electrically conductive pathways that will connect the active areas that make up the overall "cell B" so they are connected in parallel (e.g., separate photocells 462, 463, 472, and 473).

The insulative barriers between active photocells are illustrated at the reference numerals 465, 466, 475. 476, for example. On FIG. 17, these barrier illustrations are not showing the actual undoped silicon, but instead are showing the upper layers of metal that are deposited on top of these insulative barrier regions.

There are also electrically conductive pathways adjoining alternating cells in the same segment, as well as other adjacent cells of adjacent segments. An example of this would be electrical pathways that run along the horizontal area depicted at the reference numeral 478, as well as at the numeral 468. Furthermore, there are electrical pathways that run in the vertical direction, such as at 480.

FIG. 18 depicts a composite photocell 500 that is divided into nine segments numbered 501–509. Each of these segments contains multiple separate photocells that make up part of both "cell A" and "cell B." For example, in the bottom segment 509, separate photocells 510 and 511 are connected in parallel as part of the overall "cell A." In the top segment 501, separate photocells 522 and 523 are connected in parallel also to make up part of the overall "cell A." In the bottom segment 509, separate photocells 512 and 513 are connected in parallel to make up part of the overall "cell B," and in the top segment 501 separate photocells 520 and 521 are connected in parallel to make up part of the overall "cell B."

Composite photocell 500 is also constructed according to integrated circuit techniques using doped silicon for the active areas, and undoped silicon to make up insulative barriers that are covered by metallic top layers. The insulative barriers are located, for example, at the reference numerals 515, 516, 525, and 526. There are also insulative barriers in the horizontal direction between the various segments 501–509 of composite cell 500. In addition, there are electrically conductive pathways that run horizontally between segments, and these electrically conductive pathways as well as insulative barriers are found at locations such as at 518 and 527. There are also barriers and electrically conductive pathways at the very ends of the composite photocell 500, for example, at the locations 517 and 528. Finally, there are vertical electrically conductive paths, such as at the reference numeral 530.

A visual inspection of FIGS. 17 and 18 will indicate that the composite photocell 450 can be stacked with the composite photocell 500. The preferred outer dimensions of the composite photocell 500 are 0.15" (0.38 cm) by 0.71" (1.8 cm). Using the composite photocell 500 as the middle section of a stacked photocell assembly, then two composite photocells 450 can be mounted on either end of composite photocell 500. The photocell 450 illustrated in FIG. 17—using the orientation of FIG. 17—could be placed at the bottom of such a stack. The mid-section comprising composite photocell 500 could be abutted to the "top" surface 490 of composite photocell 450. In this orientation, surface 490 would be abutted to surface 540 of composite cell 500. A second composite photocell 450 would be used as the top section of this stack, however, this photocell 450 must be inverted so that its surface 490 (now at its bottom) would abut the top surface 542 of the composite photocell 500.

The result of this three-section photocell stack is a two-inch height composite photocell having a width of 0.15". This final configuration represents a fully linear photocell arrangement that will perform independent of beam size, power, wavelength, and shape over the entire length of the stacked composite photocell. This arrangement will exhibit a greatly reduced error due to rotational offset.

A logical progression would be to construct multiple stacked composite photocells of two inches in height each, and then arrange them along a longitudinal axis to create a very long twelve inch composite photocell that will exhibit the same linear properties and that will perform independent of beam size, power, wavelength, and shape over the entire length of the twelve inch detector area used in a laser receiver. Each two-inch stacked set of three composite photocells (i.e., having two photocells 450 and one photocell 500) will each have two electrical output signals, one for its "cell A" and one for its "cell B." These output pairs will be electrically connected to form a plurality of electrical output signals, similar to that of photocell 100 of FIG. 4, and even more similar to that of composite photocell 300 of FIG. 11.

It is preferred that each of the output signals from each composite photocell described hereinabove be connected to a low-noise input amplifier that is designed to work as part of a laser receiver. An exemplary low-noise laser input amplifier and receiver is described in U.S. Pat. No. 5,343,033 (by Cain), which is commonly owned by Apache Technologies, Incorporated of Dayton Ohio, and is incorporated by reference herein in its entirety. A related patent is U.S. Pat. No. 5,471,049.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A light-detecting apparatus for use in detecting pulsed light and for providing at least two electrical output signals to an input receiver unit, said light-detecting apparatus comprising:

a multiple split-cell photocell assembly having a longitudinal axis and two outer edges that are substantially parallel to said longitudinal axis, and having a transverse axis that is substantially perpendicular to said longitudinal axis, in which:

(a) a first plurality of separate active photocell areas are electrically connected to one another to form a "cell A;"

(b) a second plurality of separate active photocell areas are electrically connected to one another to form a "cell B," wherein none of the active photocell areas of said cell B are electrically connected to any of the active photocell areas of said cell A;

(c) wherein one of said first plurality of separate active photocell areas of cell A is positioned between each pair of said second plurality of separate active photocell areas of cell B, and one of said second plurality of separate active photocell areas of cell B is positioned between each pair of said first plurality of separate active photocell areas of cell A;

(d) wherein one of said first plurality of separate active photocell areas of cell A is positioned along a first of said two outer edges that are substantially parallel to said longitudinal axis, and one of said second plurality of separate active photocell areas of cell B is positioned along a second of said two outer edges that are substantially parallel to said longitudinal axis; and (e) wherein any line substantially parallel to said transverse axis that intersects said photocell assembly will intersect active photocell areas of both cell A and cell B.

2. The light-detecting apparatus as recited in claim 1, wherein said multiple split-cell photocell assembly is much greater in length along its longitudinal axis than in width along a transverse axis that is substantially perpendicular to said longitudinal axis.

3. The light-detecting apparatus as recited in claim 1, wherein each of said first plurality of separate active photocell areas of cell A are electrically connected in parallel with one another, and wherein each of said second plurality of separate active photocell areas of cell B are electrically connected in parallel with one another.

4. The light-detecting apparatus as recited in claim 3, wherein said cell A and said cell B each produce an electrical output signal when electromagnetic energy of an appropriate wavelength impacts against one of their respective separate active photocell areas.

5. A light-detecting apparatus for use in detecting pulsed light and for providing at least one electrical output signal to an input receiver unit, said light-detecting apparatus comprising:

a multiple split-cell photocell assembly having a longitudinal axis and two outer edges that are substantially parallel to said longitudinal axis, in which:
(a) a first plurality of separate active photocell areas are electrically connected to one another to form a "cell A;"
(b) a second plurality of separate active photocell areas are electrically connected to one another to form a "cell B;"
(c) wherein one of said first plurality of separate active photocell areas of cell A is positioned between each pair of said second plurality of separate active photocell areas of cell B, and one of said second plurality of separate active photocell areas of cell B is positioned between each pair of said first plurality of separate active photocell areas of cell A; and
(d) wherein one of said first plurality of separate active photocell areas of cell A is positioned along a first of said two outer edges that are substantially parallel to said longitudinal axis, and one of said second plurality of separate active photocell areas of cell B is positioned along a second of said two outer edges that are substantially parallel to said longitudinal axis, wherein said separate active photocell areas of both cell A and cell B each comprise a triangular-shaped area that:
has one of its corners located at one of two transverse outer edges that are substantially perpendicular to said longitudinal axis, has one of its sides bordering one of said transverse outer edges, and has the other two of its sides bordering either one side of an adjacent separate active photocell area or one of said two outer edges that are substantially parallel to said longitudinal axis.

6. A light-detecting apparatus for use in detecting pulsed light and for providing at least two electrical output signals to an input receiver unit, said light-detecting apparatus comprising:

a segmented multiple split-cell photocell assembly having a longitudinal axis, and having a transverse axis that is substantially perpendicular to said longitudinal axis, in which:
(a) a first plurality of separate active photocell areas are electrically connected to one another to form a "cell A;"
(b) a second plurality of separate active photocell areas are electrically connected to one another to form a "cell B," wherein none of the active photocell areas of said cell B are electrically connected to any of the active photocell areas of said cell A;
(c) wherein said multiple split-cell photocell assembly is divided into a plurality of transverse segments that are substantially perpendicular to said longitudinal axis; and
(d) wherein any line substantially parallel to said transverse axis that intersects said photocell assembly will intersect active photocell areas of both cell A and cell B.

7. The light-detecting apparatus as recited in claim 6, wherein one of said first plurality of separate active photocell areas of cell A is positioned between each pair of said second plurality of separate active photocell areas of cell B, and one of said second plurality of separate active photocell areas of cell B is positioned between each pair of said first plurality of separate active photocell areas of cell A.

8. The light-detecting apparatus as recited in claim 6, wherein said cell A and said cell B each produce an electrical output signal when electromagnetic energy of an appropriate wavelength impacts against one of their respective separate active photocell areas.

9. The light-detecting apparatus as recited in claim 6, wherein for each of said plurality of transverse segments, one of said first plurality of separate active photocell areas of cell A is positioned between each pair of said second plurality of separate active photocell areas of cell B, and one of said second plurality of separate active photocell areas of cell B is positioned between each pair of said first plurality of separate active photocell areas of cell A; and
wherein, from one said segment to each next adjacent said segment, the geometric pattern of said first plurality of separate active photocell areas of cell A visually appears to be continuous, and, from one said segment to each next adjacent said segment, the geometric pattern of said second plurality of separate active photocell areas of cell B visually appears to be continuous.

10. The light-detecting apparatus as recited in claim 6, wherein for each of said plurality of transverse segments, one of said first plurality of separate active photocell areas of cell A is positioned between each pair of said second plurality of separate active photocell areas of cell B, and one of said second plurality of separate active photocell areas of cell B is positioned between each pair of said first plurality of separate active photocell areas of cell A;
said plurality of transverse segments comprising a first group of segments that includes every other alternating said segment, and comprising a second group of segments that includes the remaining said segments that are interspersed between said first group of segments;
wherein, from one segment of said first group of segments to each next segment of said first group of segments, the geometric pattern of said first plurality of separate active photocell areas of cell A visually appears to be continuous, and the geometric pattern of said second plurality of separate active photocell areas of cell B visually appears to be continuous,
from one segment of said second group of segments to each next segment of said second group of segments, the geometric pattern of said first plurality of separate active photocell areas of cell A visually appears to be continuous, and the geometric pattern of said second plurality of separate active photocell areas of cell B visually appears to be continuous, and
from one segment of said first group of segments to each adjacent segment of said second group of segments, the geometric pattern of said first plurality of separate active photocell areas of cell A visually appears to be a mirror image along said longitudinal axis, and the geometric pattern of said second plurality of separate active photocell areas of cell B visually appears to be a mirror image along said longitudinal axis.

11. The light-detecting apparatus as recited in claim 10, wherein said cell A and said cell B each produce an electrical output signal when electromagnetic energy of an appropriate wavelength impacts against one of their respective separate active photocell areas.

12. The light-detecting apparatus as recited in claim 10, wherein at a first of said plurality of segments located at a first end of said segmented multiple split-cell photocell assembly the proportion of active area of said cell A compared to a combination of said cell A and said cell B is near zero percent (0%), and at a second of said plurality of segments located adjacent to said first segment the proportion of active area of said cell A compared to the combination of said cell A and said cell B is increased as compared to 0%, and at a third of said plurality of segments located at a second end of said segmented multiple split-cell photocell assembly the proportion of active area of said cell A compared to the combination of said cell A and said cell B is near 100%, and at a fourth of said plurality of segments located adjacent to said third segment the proportion of active area of said cell A compared to the combination of said cell A and said cell B is decreased as compared to 100%, and at a fifth of said plurality of segments located at the middle of said photocell assembly along said longitudinal axis the proportion of active area of said cell A compared to the combination of said cell A and said cell B is substantially 50%, thereby comprising a "full" cell unit.

13. The light-detecting apparatus as recited in claim 10, wherein at a first of said plurality of segments located at a first end of said segmented multiple split-cell photocell assembly the proportion of active area of said cell A compared to the combination of said cell A and said cell B is near zero percent (0%), and at a second of said plurality of segments located adjacent to said first segment the proportion of active area of said cell A compared to the combination of said cell A and said cell B is increased as compared to 0%, and at a third of said plurality of segments located at a second end of said segmented multiple split-cell photocell assembly the proportion of active area of said cell A compared to the combination of said cell A and said cell B is near 50%, and at a fourth of said plurality of segments located adjacent to said third segment the proportion of active area of said cell A compared to the combination of said cell A and said cell B is decreased as compared to 50%, and wherein said third segment is substantially one-half in length along said longitudinal axis as compared to the length of all other of said plurality of segments, thereby comprising a "half" cell unit.

14. The light-detecting apparatus as recited in claim 13, further comprising a second "half" cell unit that is inverted in orientation with respect to the first "half" cell unit, said second "half" cell unit having the same construction as said first "half" cell unit, said second "half" cell unit being positioned such that its third segment is mounted adjacent to the third segment of said first "half" cell unit in which both said third segments are electrically connected to one another, thereby creating a "middle" segment having an overall length along said longitudinal axis that is substantially equal to the length of all other of said plurality of segments of both said first and second "half" cell units, said "middle" segment further having a proportion of active area of said cell A compared to the combination of said cell A and said cell B of substantially 50%, thereby comprising a "full" cell unit.

15. The light-detecting apparatus as recited in claim 12, further comprising a plurality of said "full" cell units stacked adjacent to one another along said longitudinal axis, thereby creating a very long photocell assembly.

16. The light-detecting apparatus as recited in claim 15, wherein each of said "full" cell units produces two electrical output signals when electromagnetic energy of an appropriate wavelength impacts against one of their respective separate active photocell areas, and wherein one of said electrical output signals of one of the "full" cell units is electrically connected in parallel to one of said electrical output signals of an adjacent of said "full" gell units.

17. The light-detecting apparatus as recited in claim 14, further comprising a plurality of said "full" cell units stacked adjacent to one another along said longitudinal axis, thereby creating a very long photocell assembly.

18. The light-detecting apparatus as recited in claim 17, wherein each of said "full" cell units produces two electrical output signals when electromagnetic energy of an appropriate wavelength impacts against one of their respective separate active photocell areas, and wherein one of said electrical output signals of one of the "full" cell units is electrically connected in parallel to one of said electrical output signals of an adjacent of said "full" cell units.

19. The light-detecting apparatus as recited in claim 10, wherein at a first of said plurality of segments located at a first end of said segmented multiple split-cell photocell assembly the proportion of active area of said cell A compared to the combination of said cell A and said cell B is near zero percent (0%), and at a second of said plurality of segments located adjacent to said first segment the proportion of active area of said cell A compared to the combination of said cell A and said cell B is increased as compared to 0%, and at a third of said plurality of segments located at a second end of said segmented multiple split-cell photocell assembly the proportion of active area of said cell A compared to the combination of said cell A and said cell B is greater than 0% but less than 50%, thereby comprising an "end" cell unit.

20. The light-detecting apparatus as recited in claim 10, wherein at a first of said plurality of segments located at a first end of said segmented multiple split-cell photocell assembly the proportion of active area of said cell A compared to the combination of said cell A and said cell B is greater than 0% but less than 50%, and at a second of said plurality of segments located at a second end of said segmented multiple split-cell photocell assembly the proportion of active area of said cell A compared to the combination of said cell A and said cell B is greater than 0% but less than 50% and substantially equal to the like proportion of said first segment, thereby comprising a "middle" cell unit.

21. The light-detecting apparatus as recited in claim 19, further comprising a second "ends" cell unit and a "middle" cell unit, wherein said middle cell unit comprises
  a segmented multiple split-cell photocell assembly having a longitudinal axis, in which:
    (a) a first plurality of separate active photocell areas are electrically connected to one another to form a "cell A;"
    (b) a second plurality of separate active photocell areas are electrically connected to one another to form a "cell B;" and
    (c) wherein said multiple split-cell photocell assembly is divided into a plurality of transverse segments that are substantially perpendicular to said longitudinal axis;
  wherein for each of said plurality of transverse segments, one of said first plurality of separate active photocell areas of cell A is positioned between each pair of said second plurality of separate active photocell areas of cell B, and one of said second plurality of separate active photocell areas of cell B is positioned between each pair of said first plurality of separate active photocell areas of cell A;
    said plurality of transverse segments comprising a first group of segments that includes every other alternating said segment, and comprising a second group of segments that includes the remaining said segments that are interspersed between said first group of segments;

wherein, from one segment of said first group of segments to each next segment of said first group of segments, the geometric pattern of said first plurality of separate active photocell areas of cell A visually appears to be continuous, and the geometric pattern of said second plurality of separate active photocell areas of cell B visually appears to be continuous, from one segment of said second group of segments to each next segment of said second group of segments the geometric pattern of said first plurality of separate active photocell areas of cell A visually appears to be continuous, and the geometric pattern of said second plurality of separate active photocell areas of cell B visually appears to be continuous, and from one segment of said first group of segments to each adjacent segment of said second group of segments, the geometric pattern of said first plurality of separate active photocell areas of cell A visually appears to be a mirror image along said longitudinal axis, and the geometric pattern of said second plurality of separate active photocell areas of cell B visually appears to be a mirror image along said longitudinal axis;

wherein at a first of said plurality of segments located at a first end of said segmented multiple split-cell photocell assembly the proportion of active area of said cell A compared to the combination of said cell A and said cell B is greater than 0% but less than 50%, and at a second of said plurality of segments located at a second end of said segmented multiple split-cell photocell assembly the proportion of active area of said cell A compared to the combination of said cell A and said cell B is greater than 0% but less than 50% and substantially equal to the like proportion of said first segment; and wherein the first "end" cell unit is positioned adjacent to said first end of said "middle" cell unit along said longitudinal axis, and said second "end" cell unit is positioned adjacent to said second end of said "middle" cell unit along said longitudinal axis, thereby creating a "stacked" cell unit.

22. The light-detecting apparatus as recited in claim 21, further comprising a plurality of said "stacked" cell units stacked adjacent to one another along said longitudinal axis, thereby creating a very long photocell assembly.

23. A light-detecting apparatus for use in detecting pulsed light and for providing at least one electrical output signal to an input receiver unit, said light-detecting apparatus comprising:

a segmented multiple split-cell photocell assembly having a longitudinal axis, it which:

(a) a first plurality of separate active photocell areas are electrically connected to one another to form a "cell A;"

(b) a second plurality of separate active photocell areas are electrically connected to one another to form a "cell B;" and (c) wherein said multiple split-cell photocell assembly is divided into a plurality of transverse segments that are substantially perpendicular to said longitudinal axis, wherein each of said plurality of separate active photocell areas of both cell A and cell B have the shape of either a triangle or a trapezoid.

* * * * *

UNITED STATES PATENT AND TRADEMARK OFFICE
CERTIFICATE OF CORRECTION

PATENT NO. : 6,133,991  
DATED : October 17, 2000  
INVENTOR(S) : KuWain K. Ake

Page 1 of 1

It is certified that error appears in the above-identified patent and that said Letters Patent is hereby corrected as shown below:

COLUMN 18:
Line 45, delete [ends] and insert --end--

COLUMN 19:
Line 13, after "segments" insert --,--

COLUMN 20:
Line 19, delete [it] and insert --in--.

Signed and Sealed this

Twelfth Day of June, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 6,133,991
DATED : October 17, 2000
INVENTOR(S) : KuWain K. Ake

Page 1 of 1

It is certified that error appears in the above-identified patent and that said Letters Patent is hereby corrected as shown below:

COLUMN 18:
Line 45, delete [ends] and insert --end--

COLUMN 19:
Line 13, after "segments" insert --,--

COLUMN 20:
Line 19, delete [it] and insert --in--.

Signed and Sealed this

Twenty-sixth Day of June, 2001

*Attest:*

NICHOLAS P. GODICI
*Attesting Officer*    *Acting Director of the United States Patent and Trademark Office*